(12) United States Patent
Chou et al.

(10) Patent No.: US 8,446,189 B2
(45) Date of Patent: May 21, 2013

(54) POWER-ON RESET CIRCUIT

(75) Inventors: Yu-Pin Chou, Hsien (TW); Hsien-Chun Chang, Keelung (TW); Wen-Che Wu, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 333 days.

(21) Appl. No.: 12/794,227

(22) Filed: Jun. 4, 2010

(65) Prior Publication Data

US 2010/0308877 A1 Dec. 9, 2010

(30) Foreign Application Priority Data

Jun. 6, 2009 (TW) ................................. 98118921 A

(51) Int. Cl.
*H03L 7/00* (2006.01)
(52) U.S. Cl.
USPC .......................................................... 327/143
(58) Field of Classification Search
USPC ......................................... 327/142, 143, 198
See application file for complete search history.

(56) References Cited

U.S. PATENT DOCUMENTS 6,384,646 B2 * 5/2002 Ozawa ........................... 327/143
6,970,026 B2 11/2005 Kang

* cited by examiner

*Primary Examiner* — Daniel Rojas
(74) *Attorney, Agent, or Firm* — Pearl Cohen Zedek Latzer, LLP

(57) ABSTRACT

A power-on reset circuit includes a clamping signal generator and a determining device. The clamping signal generator is adapted to receive a trigger signal, and generates a clamping signal with reference to the trigger signal. The clamping signal generator includes an output unit for generating the clamping signal according to a feedback signal, and a feedback unit for generating the feedback signal according to first and second intermediate signals. The first intermediate signal is generated with reference to the clamping signal. The second intermediate signal is generated according to the trigger signal. The determining device is adapted to receive the trigger signal, is coupled to the clamping signal generator for receiving the clamping signal therefrom, and is operable to generate a reset signal according to the trigger signal and the clamping signal.

18 Claims, 6 Drawing Sheets

POWER-ON RESET CIRCUIT

CROSS-REFERENCE TO RELATED APPLICATION

This application claims priority of Taiwanese Application No. 098118921, filed on Jun. 6, 2009.

BACKGROUND OF THE INVENTION

1. Field of the Invention

The invention relates to a signal generating technique, more particularly to a power-on reset circuit for generating a reset signal.

2. Description of the Related Art

In general, conventional signal processing systems are initialized by a reset signal so as to ensure operation starting of the conventional signal processing systems from a predetermined status.

In most cases, the conventional power-on reset circuit 7 shown in FIG. 1 is an analog circuit, and includes a resistor 71, a capacitor 72, and a comparator 73. When a voltage across the capacitor 72, as charged by a supply voltage ($V_{DD}$), is greater than a reference voltage, a reset signal generated by the comparator 73 changes from a first predetermined logic level (0) to a second predetermined logic level (1) such that a signal processing system 6 is driven to enter an operating mode from an initial mode. On the other hand, when the capacitor 72 is discharged as a result of removal of the supply voltage ($V_{DD}$) such that the voltage across the capacitor 72 is lower than the reference voltage, the reset signal changes from the second predetermined logic level (1) to the first predetermined logic level (0).

However, since the charging/discharging rate of the capacitor 72 depends on the manufacturing process thereof, it is difficult to control transition timing of the reset signal of various power-on reset circuits, even though their circuits are of the same type.

Referring to FIG. 2, U.S. Pat. No. 6,970,026 discloses another conventional analog power-on reset circuit 8. The power-on reset circuit 8 includes an oscillator 81, a frequency detector 82 including two capacitors (C1, C2), and a comparator 83. The oscillator 81 generates an oscillating signal (ck). The capacitors (C1, C2) are charged/discharged by a supply voltage ($V_{DD}$) at a rate that depends on a switching frequency of the oscillating signal (ck). Therefore, as compared to the conventional power-on reset circuit 7 of FIG. 1, the transition point of the reset signal generated by the comparator 83 between the first and second predetermined logic levels (0, 1) can be more precisely determined.

However, a large supply voltage ($V_{DD}$) is required for operation of the conventional power-on reset circuits 7, 8. Since the signal processing system 6 may be a digital circuit, or a circuit that requires less operating power, when the signal processing system 6 and the conventional power-on reset circuit 8 are coupled to the same supply voltage, during gradual increase of the supply voltage from zero to a steady voltage level (i.e., $V_{DD}$), the signal processing system 6 may enter the operating mode prior to transition of the reset signal from the first predetermined logic level (0) to the second predetermined logic level (1). As a result, the signal processing system 6 may not have entered the operating mode from the initial mode, which is desirable, and may thus create unexpected consequences and problems.

SUMMARY OF THE INVENTION

Therefore, the object of the present invention is to provide a power-on reset circuit capable of alleviating the above drawbacks of the prior art.

Accordingly, a power-on reset circuit of this invention includes a clamping signal generator and a determining device. The clamping signal generator is adapted to receive a trigger signal, and generates a clamping signal with reference to the trigger signal. The clamping signal generator includes an output unit for generating the clamping signal according to a feedback signal, and a feedback unit for generating the feedback signal according to first and second intermediate signals. The first intermediate signal is generated with reference to the clamping signal. The second intermediate signal is generated according to the trigger signal. The determining device is adapted to receive the trigger signal, is coupled to the clamping signal generator for receiving the clamping signal therefrom, and is operable to generate a reset signal according to the trigger signal and the clamping signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
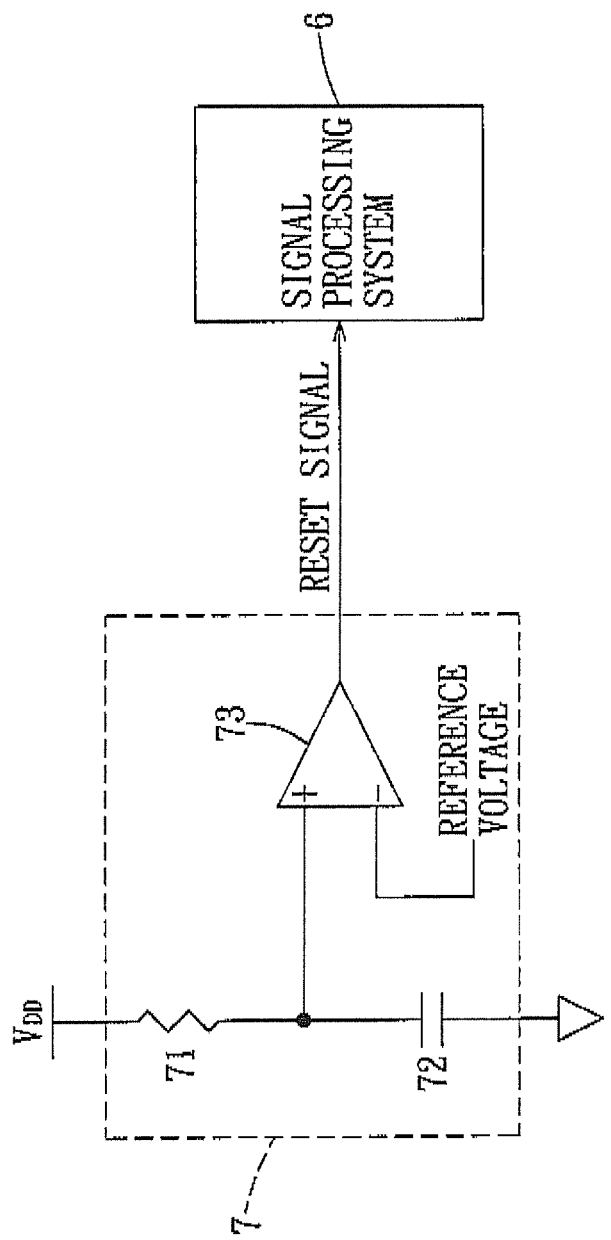
FIG. 1 is a circuit diagram of a conventional power-on reset circuit.
Figure 2:
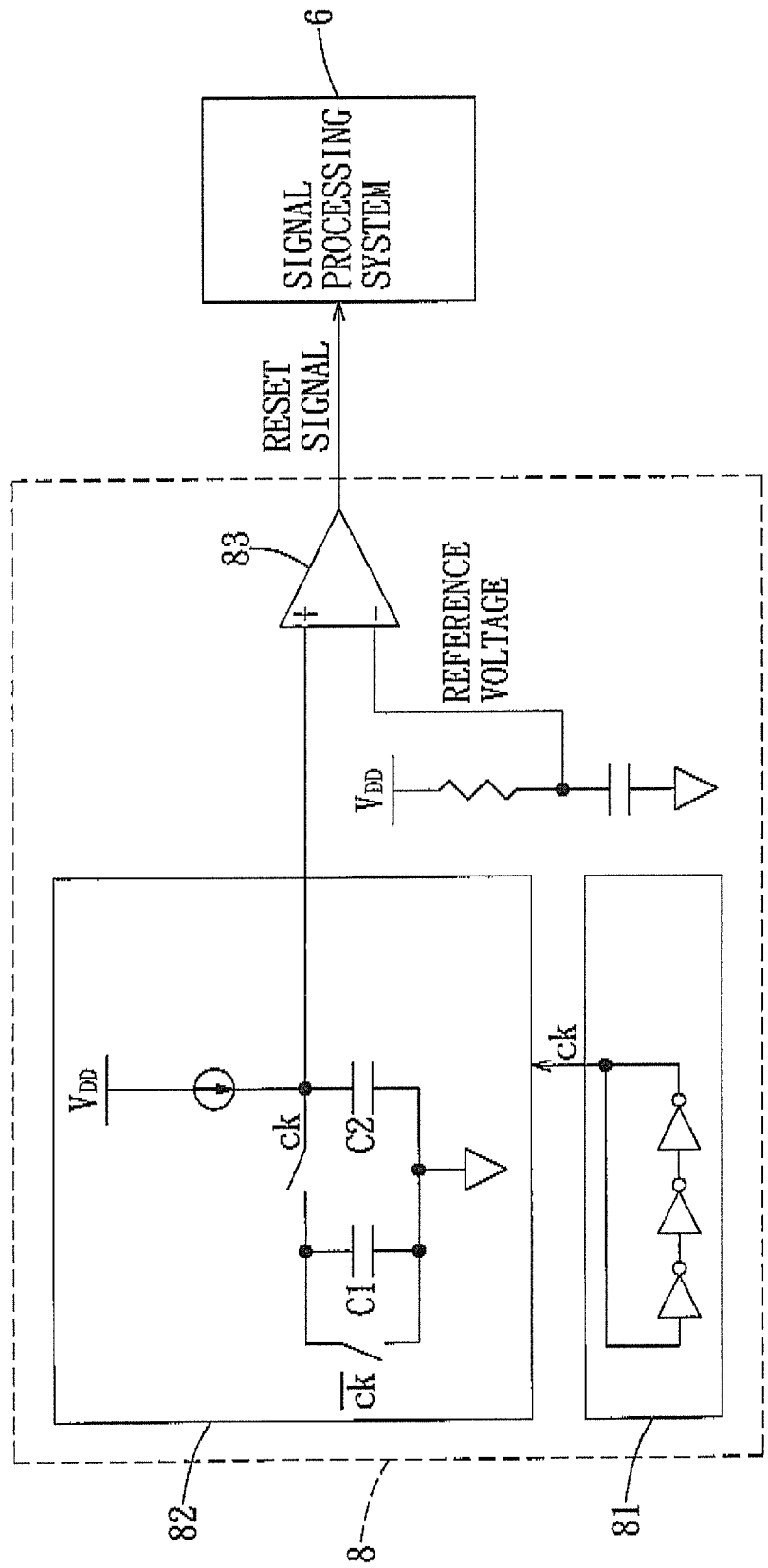
FIG. 2 is a circuit diagram of another conventional power-on reset circuit.
Figure 3:
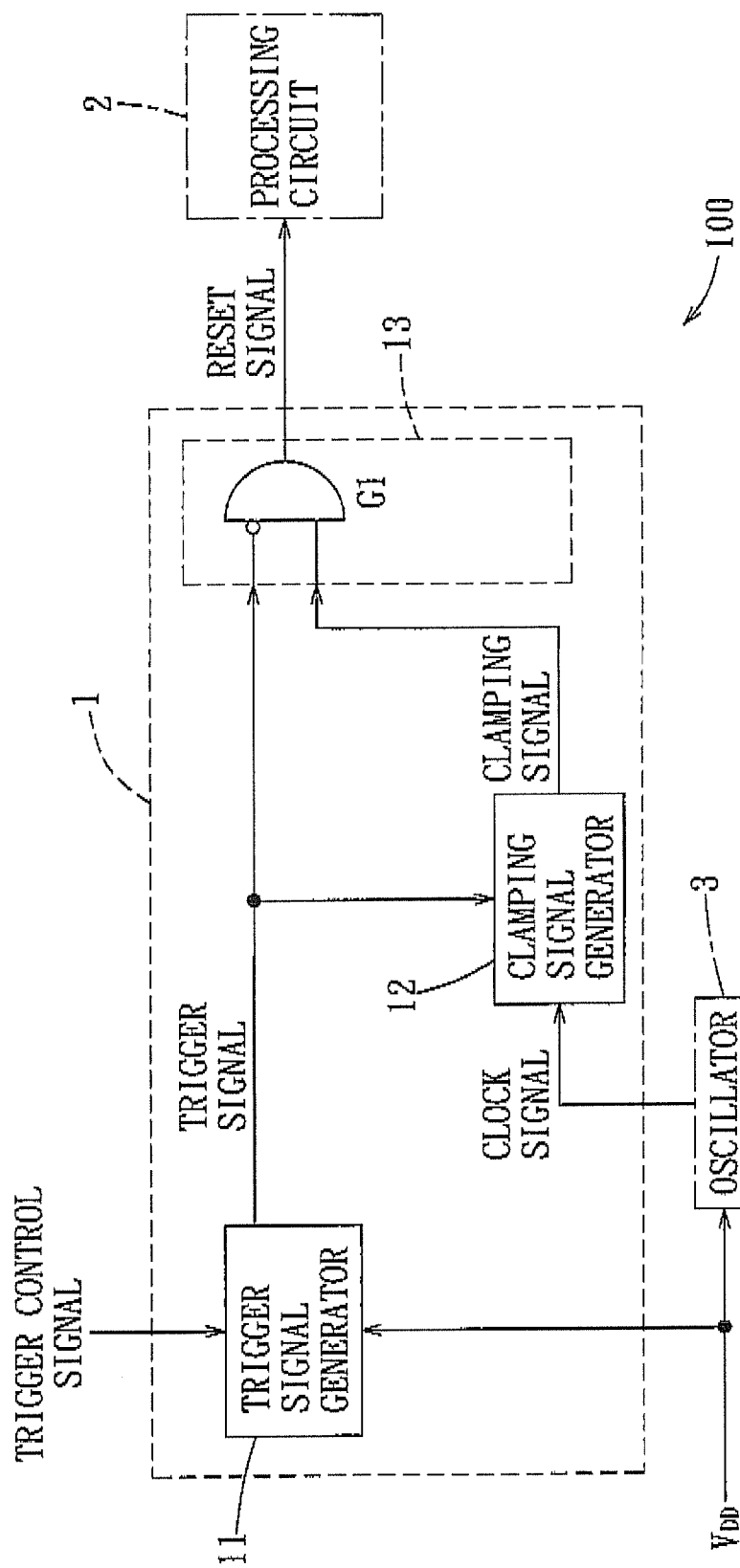
FIG. 3 is a schematic block diagram of the preferred embodiment of a power-on reset circuit according to the present invention.

Referring to FIG. 3, the preferred embodiment of a power-on reset circuit 1 according to the present invention is adapted to be disposed in an electronic system 100. The power-on reset circuit 1 includes a trigger signal generator 11, a clamping signal generator 12, and a determining device 13. The trigger signal generator 11 is an analog circuit, while the clamping signal generator 12 is a digital circuit.

The trigger signal generator 11 is a voltage comparator in this embodiment, and generates a trigger signal with reference to a supply voltage ($V_{DD}$), a reference voltage and a trigger control signal. Once the supply voltage ($V_{DD}$) becomes greater than the reference voltage, the trigger signal is controlled according to the trigger control signal to switch between a first predetermined logic level (0) and a second predetermined logic level (1). In particular, once the electronic system 100 is turned on, the supply voltage ($V_{DD}$) increases gradually from zero to a steady voltage level. Preferably, prior to the supply voltage ($V_{DD}$) becoming greater than the reference voltage, the trigger signal is maintained at the first predetermined logic level (0), and upon the supply voltage ($V_{DD}$) becoming greater than the reference voltage, the trigger signal is switched to the second predetermined logic level (1).

The determining device 13 is coupled to the trigger signal generator 11 for receiving the trigger signal therefrom, is further coupled to the clamping signal generator 12 for receiving a clamping signal therefrom, and is operable to generate a reset signal according to the trigger signal and the clamping signal. Preferably, the determining device 13 includes a logic gate (G1) for generating the reset signal that is representative of an AND operation of the clamping signal and a logic NOT signal of the trigger signal.

In addition, the electronic system 100 further includes an oscillator 3 for generating a clock signal with a predetermined period (T) according to the supply voltage ($V_{DD}$). The clamping signal generator 12 is coupled to the oscillator 3 for generating the clamping signal with reference to the clock signal.

Figure 4:
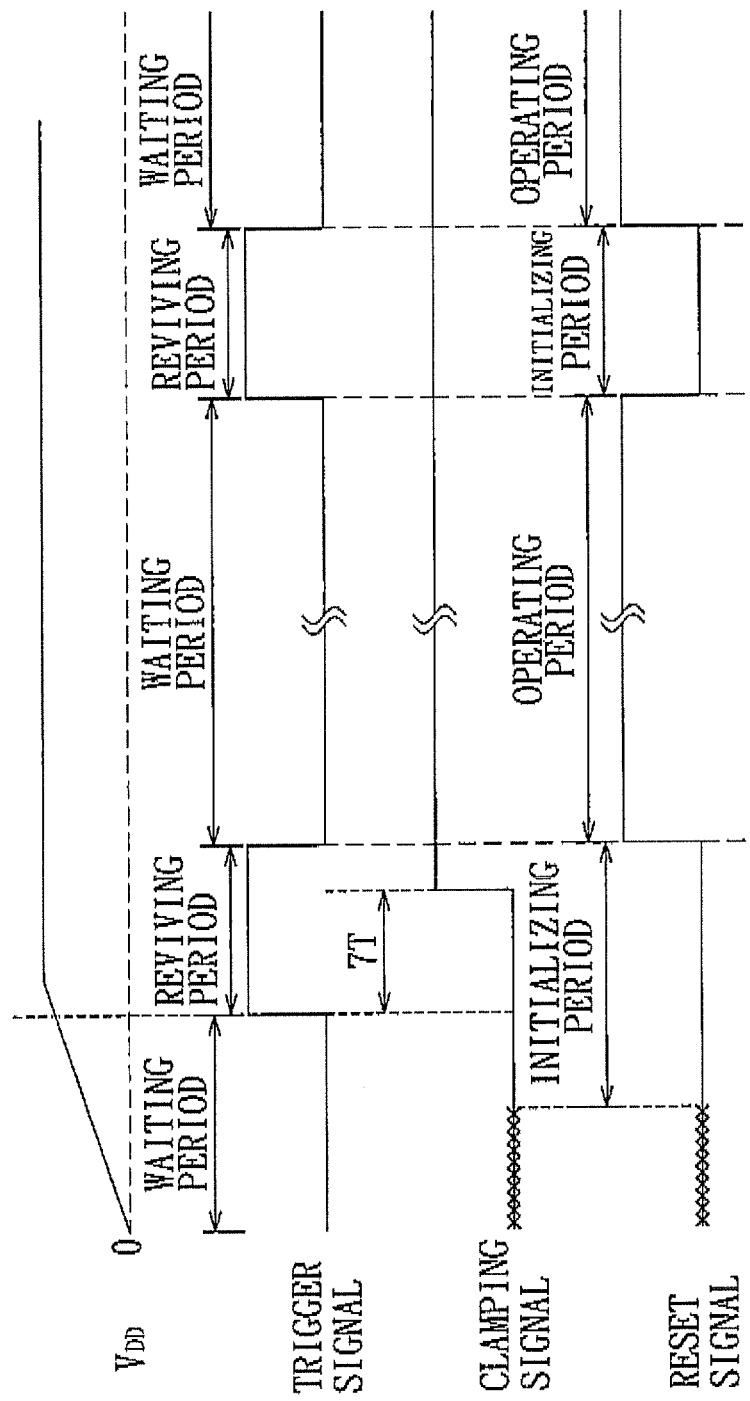
FIG. 4 illustrates timing sequences of $V_{DD}$, trigger, clamping and reset signals in the preferred embodiment.

Referring to FIG. 4, the duration of the trigger signal being at the second predetermined logic level (1) is defined as a reviving period, and the duration of the trigger signal being at the first predetermined logic level (0) is defined as a waiting period. The duration of the reset signal being at the first predetermined logic level (0) is defined as an initializing period, during which a processing circuit 2 coupled to the determining device 13 for receiving the reset signal is under an initialization mode. The duration of the reset signal being at the second predetermined logic level (1) is defined as an operating period, during which the processing circuit 2 is under an operating mode.

Referring to FIGS. 3 and 4, in order to ensure that the processing circuit 2 beings operating from a predefined state, the following two conditions must be satisfied:

(1) The reset signal is maintained at the first predetermined logic level (0), instead of being unknown, prior to the beginning of a first reviving period of the trigger signal.

(2) The reset signal is maintained at the first predetermined logic level (0) until the end of the first reviving period of the trigger signal.

As such, it can be ensured that the processing circuit 2 operates in the initialization mode prior to the beginning of the first reviving period of the trigger signal, and only enters the operating mode after the end of the first reviving period of the trigger signal. It should be noted herein that "the first" refers to the earliest time after the electronic system 100 has been turned on.

Figure 5:
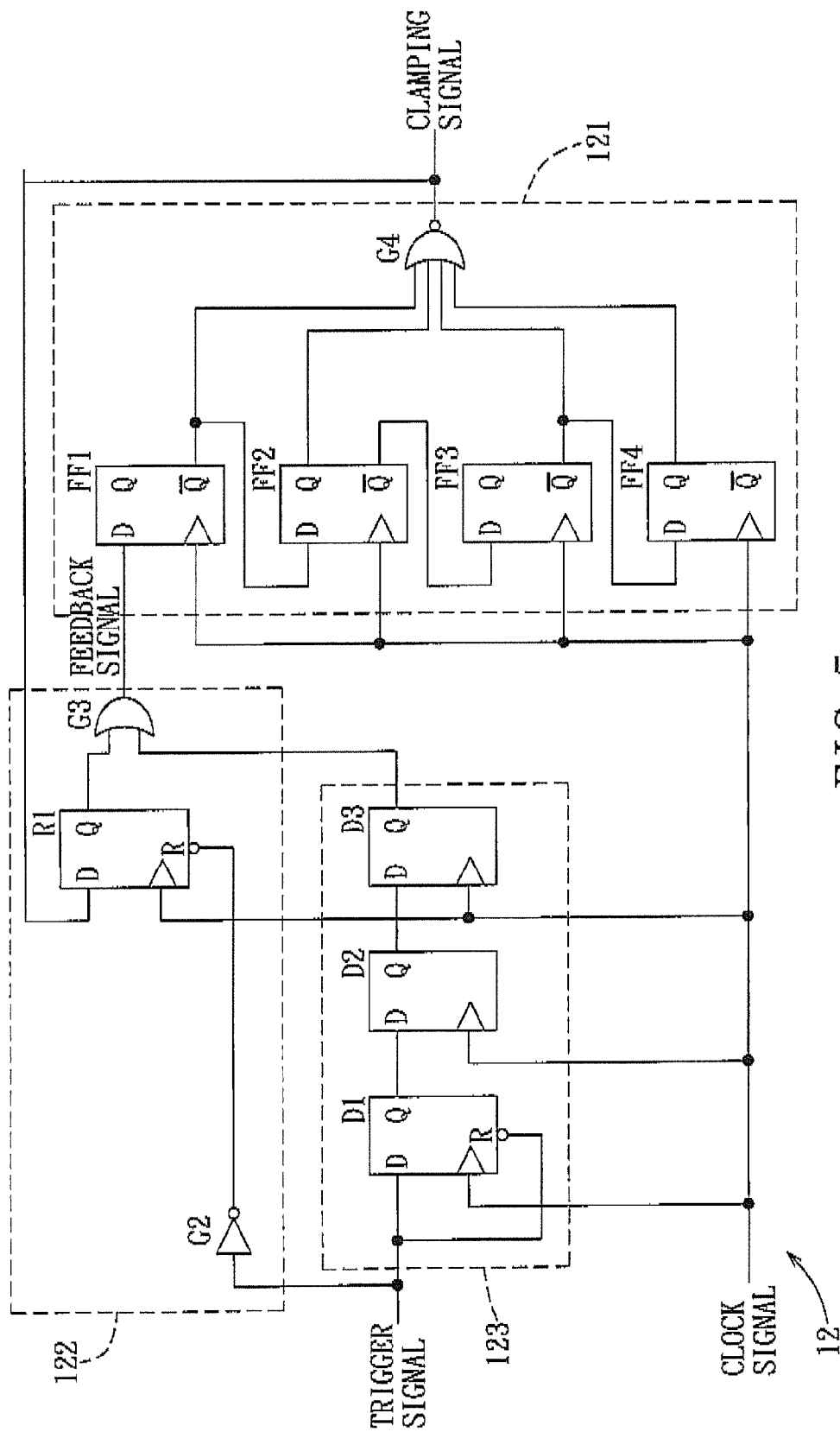
FIG. 5 is a circuit diagram illustrating a clamping signal generator of the preferred embodiment.

Further referring to FIG. 5, the clamping signal generator 12 is coupled to the trigger signal generator 11 for receiving the trigger signal, and is operable to generate the clamping signal with reference to the trigger signal. The clamping signal generator 12 includes an output unit 121, a feedback unit 122, and a delay unit 123. The output unit 121 generates the clamping signal according to a feedback signal. The feedback unit 122 generates the feedback signal according to a first intermediate signal and a second intermediate signal. The delay unit 123 is coupled to the trigger signal generator 11 (shown in FIG. 3) for receiving the trigger signal therefrom, and is operable to output the trigger signal as the second intermediate signal after the trigger signal has been received thereby for a predetermined delay time.

In this embodiment, the feedback unit 122 includes a flip-flop (R1) coupled to the output unit 121 for receiving the clamping signal therefrom, further coupled to the trigger signal generator 11 for receiving the trigger signal therefrom, and operable to output one of the clamping signal and the first predetermined logic level (0) as the first intermediate signal according to the trigger signal. In this embodiment, the flip-flop (R1) has an input terminal (D) coupled to the output unit 121 for receiving the clamping signal therefrom, an asynchronous reset terminal (R) coupled to the trigger signal generator 11 (shown in FIG. 3) for receiving the trigger signal therefrom, a clock terminal coupled to the oscillator 3 (shown in FIG. 3) for receiving the clock signal therefrom, and an output terminal (Q). The flip-flop (R1) outputs the clamping signal as the first intermediate signal at a rising (or falling) edge of the clock signal (in sync with the clock signal) when the trigger signal is at the first predetermined logic level (0), and outputs the first predetermined logic level (0) as the first intermediate signal asynchronous with the clock signal when the trigger signal is at the second predetermined logic level (1). In this embodiment, and the feedback unit 122 further includes an inverter (G2) between the trigger signal generator 11 and the asynchronous reset terminal (R) of the flip-flop (R1).

The delay unit 123 includes first, second and third delay devices (D1, D2, D3). The first delay device (D1) has an input terminal (D) that is coupled to the trigger signal generator 11 (shown in FIG. 3) for receiving the trigger signal therefrom, and is operable to output, at an output terminal (Q) thereof, one of the trigger signal and the first predetermined logic level (0) as a first delay signal according to the trigger signal after the trigger signal has been received thereby for a predetermined unit time. In particular, a reset terminal (R) of the first delay device (D1) is controlled by a complement of the trigger signal, such that when the trigger signal is at the first predetermined logic level (0), the first delay device (D1) is reset and outputs the first predetermined logic level (0) as the first delay signal after the predetermined unit time has lapsed, and that when the trigger signal is at the second predetermined logic level (1), the first delay device (D1) outputs the trigger signal as the first delay signal after the predetermined unit time has lapsed. The second delay device (D2) has an input terminal (D) that is coupled to the output terminal (Q) of the first delay device (D1) for receiving the first delay signal therefrom, and is operable to output, at an output terminal (Q) thereof, the first delay signal as a second delay signal after the first delay signal has been received thereby for the predetermined unit time. The third delay device (D3) has an input terminal (D) that is coupled to the output terminal (Q) of the second delay device (D2) for receiving the second delay signal therefrom, and is operable to output, at an output terminal (Q) thereof, the second delay signal as the second intermediate signal after the second delay signal has been received thereby for the predetermined unit time. In this embodiment, each of the first, second and third delay devices (D1~D3) further has a clock input terminal coupled to the oscillator 3 (shown in FIG. 3) for receiving the clock signal therefrom. As a result, the predetermined unit time is the predetermined period (T) of the clock signal, and the predetermined delay time is the sum of three predetermined unit times (i.e., 3T).

In addition, the feedback unit 122 further includes a logic OR gate (G3) coupled to the flip-flop (R1) and the third delay device (D3) for respectively receiving the first and second intermediate signals therefrom, and generates the feedback signal that is representative of an OR operation of the first and second intermediate signals.

Preferably, the output unit 121 includes an output logic unit (G4) having a plurality of, or preferably (2N) number of, input terminals, and a plurality of, or preferably (2N) number of, flip-flops, where (N) is a positive integer. Each of the flip-flops has an input terminal, a first output terminal for outputting a first output signal, and a second output terminal for outputting a second output signal that is a complement of the first output signal. The input terminal of a first one of the flip-flops is coupled to the feedback unit 122 for receiving the feedback signal therefrom. The first output terminal of the first one of the flip-flops outputs the feedback signal as a first output signal after the feedback signal has been received via the first input terminal for the predetermined unit time. The second output terminal of the first one of the flip-flops outputs a complement of the feedback signal as a first complement output signal after the feedback signal has been received for the predetermined unit time. One of the first and second output terminals of each of the first to the penultimate ones of the flip-flops (i.e., the first to a $(2N-1)^{th}$ one of the flip-flops) is coupled to the input terminal of a corresponding next one of the flip-flops. One of the first and second output terminals (the first output terminal in this embodiment) of each of even ones of the flip-flops is coupled to a corresponding one of the input terminals of the output logic unit (G4). Another one of the first and second output terminals (the second output terminal in this embodiment) of each of odd ones of the flip-flops is coupled to a corresponding one of the input terminals of the output logic unit (G4). The output logic unit (G4) outputs the clamping signal according to signals received via the input terminals thereof.

In this embodiment, the number (N) is two. The output unit 121 includes four flip-flops, namely a first flip-flop (FF1), a second flip-flop (FF2), a third flip-flop (FF3), and a fourth flip-flop (FF4). The first flip-flop (FF1) has a first input terminal (D) coupled to the logic OR gate (G3) of the feedback unit 122 for receiving the feedback signal therefrom, a first normal output terminal (Q) for outputting the feedback signal as a first normal output signal after the feedback signal has been received via the first input terminal (D) for the predetermined unit time, and a first complement output terminal ($\overline{Q}$) for outputting a complement of the feedback signal as a first complement output signal after the feedback signal has been received for the predetermined unit time. The second flip-flop (FF2) has a second input terminal (D) coupled to the first complement output terminal ($\overline{Q}$) of the first flip-flop (FF1) for receiving the first complement output signal therefrom, a second normal output terminal (Q) for outputting the first complement output signal as a second normal output signal after the first complement output signal has been received via the second input terminal (D) for the predetermined unit time, and a second complement output terminal ($\overline{Q}$) for outputting a complement of the first complement output signal as a second complement output signal after the first complement output signal has been received via the second input terminal (D) for the predetermined unit time. The third flip-flop (FF3) has a third input terminal (D) coupled to the second complement output terminal ($\overline{Q}$) of the second flip-flop (FF2) for receiving the second complement output signal therefrom, and a third complement output terminal ($\overline{Q}$) for outputting a complement of the second complement output signal as a third complement output signal after the second complement output signal has been received via the third input terminal (D) for the predetermined unit time. The fourth flip-flop (FF4) has a fourth input terminal (D) coupled to the third complement output terminal ($\overline{Q}$) of the third flip-flop (FF3) for receiving the third complement output signal therefrom, and a fourth normal output terminal (Q) for outputting the third complement output terminal as a fourth normal output signal after the third complement output signal has been received via the fourth input terminal (D) for the predetermined unit time. In the previous paragraph, the first to fourth normal output terminals (Q) of the first to fourth flip-flops (FF1~FF4) refer to the "first output terminals" of these flip-flops, and the first to fourth complement output terminals ($\overline{Q}$) of the first to fourth flip-flops (FF1~FF4) refer to the "second output terminals" of these flip-flops. In addition, the first to fourth normal output signals of the first to fourth flip-flops (FF1~FF4) refer to the "first output signals" of these flip-flops, and the first to fourth complement output signals of the first to fourth flip-flops (FF1~FF4) refer to the "second output signals" of these flip-flops.

Moreover, the output logic unit (G4) has four input terminals. The input terminals of the output logic unit (G4) are coupled respectively to the first and third complement output terminals ($\overline{Q}$) of the first and third flip-flops (FF1, FF3) and the second and fourth normal output terminals (Q) of the second and fourth flip-flops (FF2, FF4) for respectively receiving the first and third complement output signals and the second and fourth normal output signals therefrom. The output logic unit (G4) generates the clamping signal according to these signals. In this preferred embodiment, each of the first to the fourth flip-flops (FF1~FF4) is a D-type flip-flop. The output logic unit (G4) is a four-input logic NOR gate, and the clamping signal is representative of a logic NOR operation of the signals received by the logic NOR gate.

As with the delay devices (D1~D3), each of the first to the fourth flip-flops (FF1~FF4) further has a clock input terminal coupled to the oscillator 3 (as shown in FIG. 3) for receiving the clock signal therefrom, and the predetermined unit time is the predetermined period (T) of the clock signal.

For simplicity of illustration, in the following descriptions, the first complement output signal of the first flip-flop (FF1), the second normal output signal of the second flip-flop (FF2), the third complement output signal of the third flip-flop (FF3), and the fourth normal output signal of the fourth flip-flop (FF4) to be received by the output logic unit (G4) are referred to respectively as a first logic signal, a second logic signal, a third logic signal, and a fourth logic signal. In addition, the first predetermined logic level (0) will be referred to as "logic low", and the second predetermined logic level (1) will be referred to as "logic high" in the following description. Moreover, the predetermined period (T) of the clock signal will be referred to as "clock cycle (T)".

Figure 6:
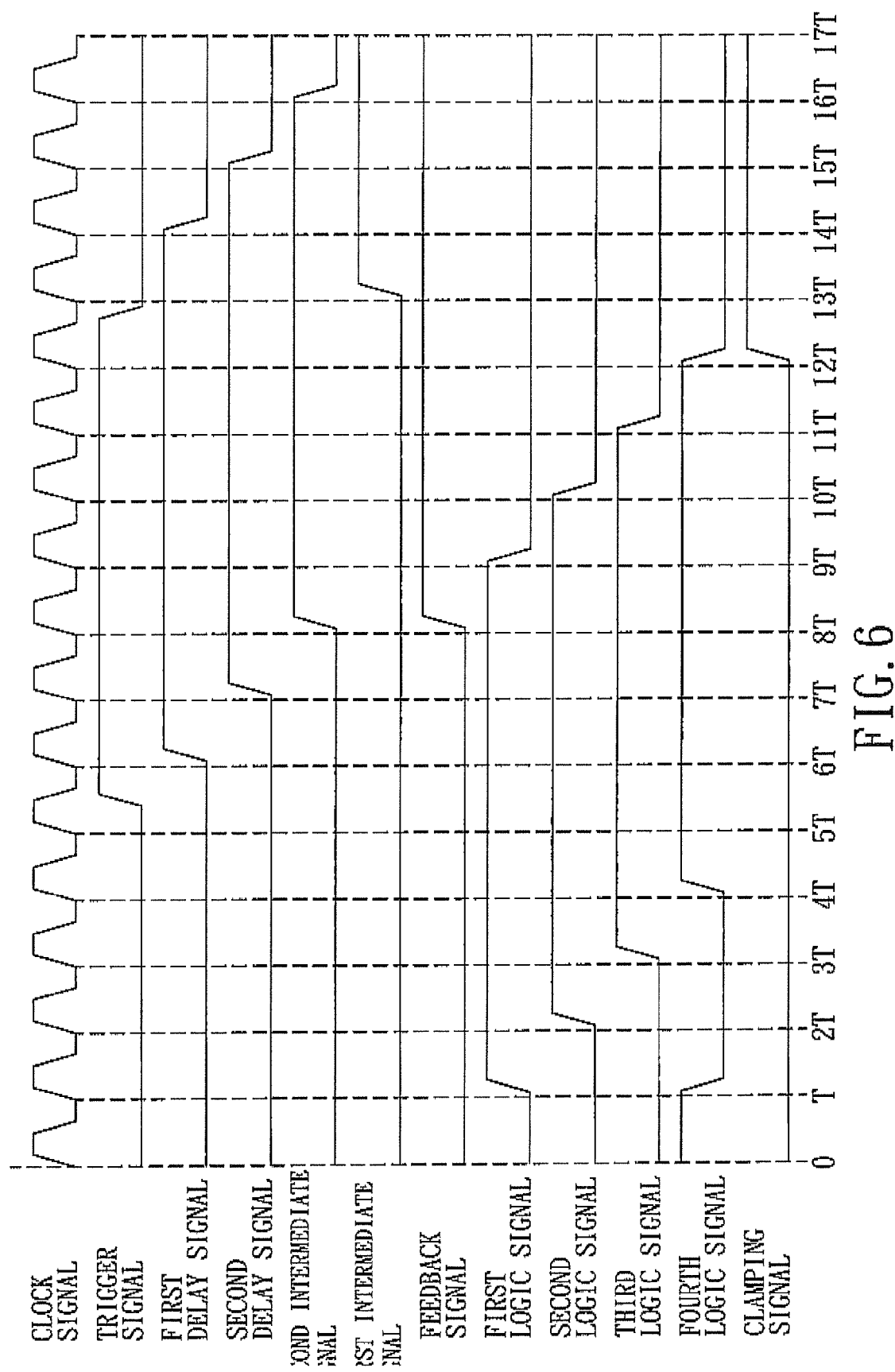
FIG. 6 illustrates timing sequences of various signals relevant to generation of the clamping signal by the clamping signal generator.

Further referring to FIG. 6, it is assumed that at time (t=0), each of the first and second delay signals, the second intermediate signal, and the first, second and third logic signals is at logic low, that the fourth logic signal is at logic high, and that the clamping signal is at logic low.

At time (t=0~T), the supply voltage ($V_{DD}$) increases gradually following turn-on of the electronic system 100, but has not yet reached the value of the reference voltage at time (t=T). Therefore, the trigger signal is at logic low. Since the output logic unit (G4) is a logic NOR gate, whenever at least one of the first, second, third and fourth logic signals is at logic high, the clamping signal generated by the output logic unit (G4) would be at logic low. Since the fourth logic signal is initially at logic high, the clamping signal generated by the output logic unit (G4) and to be received by the determining unit 13 at time (t=T) is at logic low. With the trigger signal and the clamping signal both at logic low, the reset signal generated by the logic gate (G1) of the determining device 13 is at logic low, instead of being "unknown" or "indefinite" as in the prior art, at time (t=T). Consequently, unlike the prior art, the processing circuit 2 is prevented from receiving an "unknown" reset signal, and can begin to operate in the initialization mode prior to entry of the trigger signal into the first reviving period.

Until time (t=5T), the supply voltage ($V_{DD}$) is still insufficient for initiating a first reviving period of the trigger signal (i.e., the supply voltage ($V_{DD}$) is still lower than the reference voltage). Therefore, the trigger signal is still at logic low, such that the first intermediate signal outputted by the flip-flop (R1) of the feedback unit 122 follows the clamping signal, and is at logic low. With the trigger signal being at logic low, the first delay device (D1) of the delay unit 123 is constantly being reset at each rising edge of the clock signal between time (t=2T) and time (t=5T), so that the first delay signal is maintained at logic low until time (t=6T), such that the second delay signal outputted by the second delay device (D2) is maintained at logic low until time (t=7T), and such that the second intermediate signal outputted by the third delay device (D3) is maintained at logic low until time (t=8T). Consequently, prior to time (t=8T), the feedback signal outputted by the logic OR gate (G3) is maintained at logic low.

Furthermore, due to the connections among the first to the fourth flip-flops (FF1~FF4), and since the third logic signal is initially at logic low and the feedback signal received by the first flip-flop (FF1) at time (t=T) is at logic low, the first logic signal transitions from logic low to logic high during time (t=T) and time (t=2T), the second logic signal transitions from logic low to logic high during time (t=2T) and time (t=3T), the third logic signal transitions from logic low to logic high during time (t=3T) and time (t=4T), and the fourth logic signal transitions from logic high to logic low during time (t=T) and time (t=2T), and back from logic low to logic high during time (t=4T) and time (t=5T). Since the feedback signal outputted by the logic OR gate (G3) is maintained at logic low until time (t=8T), the first, second, third and fourth logic signals are maintained at logic high until time (t=8T), such that the clamping signal is maintained at logic low until time (t=8T).

It should be noted herein that, at time (t≧6T), if the trigger signal does not transition from logic low to logic high (i.e., the supply voltage ($V_{DD}$) continues to be insufficiently high), the first, second, third and fourth logic signals will be maintained at logic high, and the clamping signal will be maintained at logic low, such that the processing circuit 2 is maintained under the initialization mode.

By time (t=6T), the supply voltage ($V_{DD}$) has become greater than the reference voltage, such that the trigger signal has transitioned from logic low to logic high according to the trigger control signal (i.e., this is the beginning of the first reviving period). At the same time, the flip-flop (R1) is reset so that the first intermediate signal outputted thereby is forced to be at logic low. With the first intermediate signal being at logic low, the feedback signal outputted by the logic OR gate (G3) is now completely dependent on the logic state of the second intermediate signal. With the trigger signal transitioning from logic low to logic high during time (t=5T) and time (t=6T), due to the serial connections between adjacent delay devices (D1, D2, D3), the first delay signal outputted by the first delay device (D1) transitions from logic low to logic high at the rising edge of the clock signal during time (t=6T) and time (t=7T), the second delay signal outputted by the second delay device (D2) transitions from logic low to logic high at the rising edge of the clock signal during time (t=7T) and time (t=8T), and the third delay signal outputted by the third delay device (D3) transitions from logic low to logic high at the rising edge of the clock signal during time (t=8T) and time (t=9T). In other words, since there are three delay devices (D1, D2, D3) in this embodiment, three units of the predetermined unit time (i.e., three clock cycles (3T)) are required for the second intermediate signal to transition from logic low to logic high. As a result, the feedback signal remains at logic low until time (t=8T), and transitions to logic high at the rising edge of the clock signal during time (t=8T) and time (t=9T).

Subsequently, the first logic signal transitions from logic high to logic low at the rising edge of the clock signal during time (t=9T) and time (t=10T), the second logic signal transitions from logic high to logic low at the rising edge of the clock signal during time (t=10T) and time (t=11T), the third logic signal transitions from logic high to logic low at the rising edge of the clock signal during time (t=11T) and time (t=12T), and the fourth logic signal transitions from logic high to logic low at the rising edge of the clock signal during time (t=12T) and time (t=13T). As the fourth logic signal becomes logic low, all of the first to the fourth logic signals are now at logic low such that the clamping signal generated by the output logic unit (G4) transitions from logic low to logic high substantially simultaneously with the transition of the fourth logic signal from logic high to logic low (i.e., during time (t=12T) and time (t=13T)).

With the clamping signal now at logic high, the trigger signal is controlled according to the trigger control signal to transition from logic high to logic low (i.e., this is the end of the first reviving period and the beginning of the second waiting period) so as to ensure that the flip-flop (R1) of the feedback unit 122 is not reset, and that the first intermediate signal outputted by the flip-flop (R1) can follow the clamping signal to transition to logic high at the rising edge of the clock signal during time (t=13T) and time (t=14T), to thereby maintain the feedback signal and the clamping signal at logic high hereon forward at least until the next reviving period of the trigger signal. In addition, when the trigger signal is at logic low while the clamping signal is at logic high, the reset signal generated by the logic gate (G1) of the determining unit 13 (shown in FIG. 3) becomes logic high and transitions from the initial period to the operating period (as shown in FIG. 4).

Referring to FIG. 4, after the end of the second waiting period, the reset signal transitions from logic high to logic low with transition of the trigger signal from logic low to logic high (i.e., transition of the reset signal from the operating period to the initializing period is controlled according to transition of the trigger signal from the waiting period to the reviving period), and the reset signal transitions from logic low to logic high with transition of the trigger signal from logic high to logic low (i.e., transition of the reset signal from the initializing period to the operating period is controlled according to transition of the trigger signal from the reviving period to the waiting period) as long as each reviving period is longer than seven clock cycles (i.e., 7T). In other words, after the first initializing period of the reset signal, the reset signal is completely controlled according to the trigger signal (or the trigger control signal) for driving the processing circuit 2 under one of the initialization mode and the operating mode.

It should be noted herein that it is required for the number of delay devices in the delay unit 123 to be at least one more than the number of flip-flops (i.e., one in this embodiment) in the feedback unit 122 to provide for synchronization with the clock signal, while ensuring that the feedback signal initially follows the logic state of the clamping signal (delayed by one clock cycle (T)) (as opposed to following the logic state of the trigger signal (delayed by at least two clock cycles (2T) (three clock cycles (3T) in this embodiment)) once the trigger signal transitions to the waiting period. It should also be noted that the number of delay devices in the delay unit 123 are at least two, such that asynchronization of the trigger signal with the clock signal may not affect the stability of the clamping signal generator 12. As the number of delay devices (D1, D2, D3) in the delay unit 123 increases, synchronization of the clamping signal generator 12 with the clock signal becomes better, and transparency of noise signals carried by the trigger signal can be avoided as well.

Referring to the period between time (t=6T) and time (t=13T) in FIG. 6; it is evident that seven clock cycles (7T) in total (one clock cycle for each of three delay devices (D1~D3) and four flip-flops (FF1~FF4)) are required for the clamping signal to transition from logic low to logic high following entry of the trigger signal into the first reviving period. In other words, the more delay devices and flip-flops are employed, the greater the time difference would be between the first transitions of the trigger signal and the clamping signal from logic low to logic high. Accordingly, as the delay devices and flip-flops increase in number, the reviving period of the trigger signal has to increase in length as well, so as to ensure that the clamping signal is transitioned to logic high prior to every entry of the trigger signal into the waiting period.

In this preferred embodiment, it is necessary for the clamping signal to initially be at logic low in order for the reset signal to respond to the first reviving period of the trigger signal. To satisfy this initial condition, it is required for at least one of the first, second, third, and fourth logic signals to initially be at logic high. Since the initial values of the output signals of the flip-flops (FF1~FF4) are not set when the electronic system 100 is just turned on, it is preferable for at least one of the flip-flops (FF1~FF4) to be coupled to the input terminals of the output logic unit (G4) via a different one of the normal output and complement output terminals (Q, $\overline{Q}$) than the other flip-flops (FF1~FF4).

The reason behind this is that the probability (P) for the initial value of the normal output signal of each of the flip-flops (FF1~FF4) that are fabricated together to be logic low (0) is the same. When the normal output terminals (Q) of the first to the fourth flip-flops (FF1~FF4) are used to couple to the input terminals of the output logic unit (G4), the probability of the initial condition to be "not satisfied" is $P^4$, which is relatively higher when $P \geq 0.5$ and relatively lower when $P < 0.5$. As a result, it is difficult to forecast whether the initial condition will be satisfied or not if all of the flip-flops (FF1~FF4) are coupled to the output logic unit (G4) via the normal output terminals (Q) or if all of the flip-flops (FF1~FF4) are coupled to the output logic unit (G4) via the complement output terminals ($\overline{Q}$). Therefore, in order to minimize the probability of the initial condition being not satisfied, at least one of the flip-flops (FF1~FF4) is coupled to the output logic unit (G4) via a different one of the normal output and complement output terminals (Q, $\overline{Q}$) than the other flip-flops (FF1~FF4).

It should be noted herein that the output unit 121 may include only two flip-flops (FF1, FF2) in other embodiments of this invention. Accordingly, the output logic unit (G4) would only have two input terminals respectively coupled to the normal output terminal of one of the flip-flops (FF1, FF2) and the complement output terminal of the other one of the flip-flops (FF1, FF2). Alternatively, as described above, the output unit 121 may include any other even number (2N) of flip-flops that are connected in a manner similar to that shown in FIG. 5. The greater the even number (2N) is, the higher will be the probability that the initial condition is satisfied.

Moreover, since the processing circuit 2 is a low-active circuit in this embodiment, the logic gate (G1) of the determining device 13 enables the reset signal to be at logic low during the initializing period, and at logic high during the operating period. However, if the processing circuit 2 is a high-active circuit, the determining device 13 would further include an inverter (not shown) to be coupled to the output terminal of the logic gate (G1). It should be noted herein that the present invention is not limited to the particular logic gates utilized in the power-on reset circuit, and other equivalent logic devices may be employed.

In summary, the power-on reset circuit of the present invention provides a digital clamping signal generator 12 and an analog trigger signal generator 11 for generating the reset signal to control operation of the processing circuit 2 and for ensuring that the reset signal is at the initializing period prior to the first reviving period of the trigger signal, and enters the operating period only after the end of the first reviving period of the trigger signal. In addition, the time that the processing circuit 2 enters the operating period is dependent on the number of delay devices and flip-flops employed in the clamping signal generator 12, and is not dependent on the manufacturing process of the components, which is the case in the prior art.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A power-on reset circuit comprising:
    clamping signal generator adapted to receive a trigger signal, and generating a clamping signal with reference to the trigger signal, the clamping signal generator including
    an output unit for generating the clamping signal according to a feedback signal, and
    a feedback unit for generating the feedback signal according to first and second intermediate signals, the first intermediate signal being generated with reference to the clamping signal, the second intermediate signal being generated according to the trigger signal; and
    a determining device adapted to receive the trigger signal, coupled to the clamping signal generator for receiving the clamping signal therefrom, and operable to generate a reset signal according to the trigger signal and the clamping signal;
    wherein the clamping signal generator further includes a delay unit adapted to receive the trigger signal, and operable to output the trigger signal as the second intermediate signal after the trigger signal has been received thereby for a predetermined delay time.

2. The power-on reset circuit as claimed in claim 1, further comprising a trigger signal generator for generating the trigger signal with reference to a supply voltage and a reference voltage, the clamping signal generator and the determining device being coupled to the trigger signal generator for receiving the trigger signal therefrom.

3. The power-on reset circuit as claimed in claim 1, wherein the feedback unit includes a flip-flop coupled to the output unit for receiving the clamping signal therefrom, further receiving the trigger signal, and operable to output one of the clamping signal and a predetermined logic level as the first intermediate signal according to the trigger signal, the delay unit including a first delay device that is adapted to receive the trigger signal, and that is operable to output one of the trigger signal and the predetermined logic level as the second intermediate signal according to the trigger signal, the flip-flop being operable to output the predetermined logic level as the first intermediate signal when the first delay device outputs the trigger signal as the second intermediate signal, the flip-flop being operable to output the clamping signal as the first intermediate signal when the first delay device outputs the predetermined logic level as the second intermediate signal.

4. The power-on reset circuit as claimed in claim 3, wherein the feedback unit further includes a logic OR gate coupled to the flip-flop for receiving the first intermediate signal therefrom, and to the first delay device for receiving the second intermediate signal therefrom, and for generating the feedback signal that is representative of a logic OR operation of the first and second intermediate signals.

5. The power-on reset circuit as claimed in claim 1, wherein the output unit of the clamping signal generator includes:

a first flip-flop having a first input terminal coupled to the feedback unit for receiving the feedback signal therefrom, a first output terminal for outputting the feedback signal as a first output signal after the feedback signal has been received via the first input terminal for a predetermined unit time, and a first complement output terminal for outputting a complement of the feedback signal as a first complement output signal after the feedback signal has been received for the predetermined unit time;

a second flip-flop having a second input terminal coupled to the first complement output terminal of the first flip-flop for receiving the first complement output signal therefrom, and a second output terminal for outputting the first complement output signal as a second output signal after the first complement output signal has been received via the second input terminal for the predetermined unit time; and an output logic unit having a first input terminal coupled to the first complement output terminal for receiving the first complement output signal therefrom, and a second input terminal coupled to the second output terminal for receiving the second output signal therefrom, the output logic unit generating the clamping signal according to the first complement output signal and the second output signal.

6. The power-on reset circuit as claimed in claim 5, wherein the second flip-flop further has a second complement output terminal for outputting a complement of the first complement output signal as a second complement output signal after the first complement output signal has been received via the second input terminal for the predetermined unit time, the output unit of the clamping signal generator further including:

a third flip-flop having a third input terminal coupled to the second complement output terminal for receiving the second complement output signal therefrom, and a third complement output terminal for outputting the second complement output signal as a third complement output signal after the second complement output signal has been received via the third input terminal for the predetermined unit time; and a fourth flip-flop having a fourth input terminal coupled to the third complement output terminal for receiving the third complement output signal therefrom, and a fourth output terminal for outputting the third complement output terminal as a fourth output signal after the third complement output signal has been received via the fourth input terminal for the predetermined unit time.

7. The power-on reset circuit as claimed in claim 5, wherein the first and second input terminals respectively receive the feedback signal and the first complement output signal according to a clock signal.

8. The power-on reset circuit as claimed in claim 5, wherein each of the first and second flip-flops is a D-type flip-flop.

9. The power-on reset circuit as claimed in claim 5, wherein the output logic unit is a logic NOR gate.

10. The power-on reset circuit as claimed in claim 1, wherein the output unit includes an output logic unit having (2N) number of input terminals, and (2N) number of flip-flops, (N) being a positive integer, each of the flip-flops having an input terminal, a first output terminal for outputting a first output signal, and a second output terminal for outputting a second output signal that is a complement of the first output signal, the input terminal of a first one of the flip-flops being coupled to the feedback unit for receiving the feedback signal therefrom, the second output terminal of each of the first to a $(2N-1)^{th}$ one of the flip-flops being coupled to the input terminal of a corresponding next one of the flip-flops, one of the first and second output terminals of each of even ones of the flip-flops being coupled to a corresponding one of the input terminals of the output logic unit, another one of the first and second output terminals of each of odd ones of the flip-flops being coupled to a corresponding one of the input terminals of the output logic unit, the output logic unit outputting the clamping signal according to signals received via the input terminals.

11. The power-on reset circuit as claimed in claim 2, wherein the trigger signal generator is a voltage comparator.

12. The power-on reset circuit as claimed in claim 11, wherein the trigger signal generator is an analog circuit, and the clamping signal generator is a digital circuit.

13. A power-on reset circuit comprising:

a clamping signal generator adapted to receive a trigger signal that varies between first and second logic levels, and operable to generate a clamping signal with reference to the trigger signal; and a determining device adapted to receive the trigger signal, coupled to the clamping signal generator for receiving the clamping signal therefrom, and operable to generate a reset signal according to the trigger signal and the clamping signal;

wherein the clamping signal is maintained at a first predetermined logic level before a first transition of the trigger signal between the first and second logic levels, such that the reset signal is maintained at a second predetermined logic level before the first transition of the trigger signal between the first and second logic levels;

wherein the clamping signal generator includes:

an output unit for generating the clamping signal according to a feedback signal, and a feedback unit for generating the feedback signal according to first and second intermediate signals, the first intermediate signal being generated with reference to the clamping signal, intermediate signal being generated according to the trigger signal; and a delay unit adapted to receive the trigger signal, and operable to output the trigger signal as the second intermediate signal after the trigger signal has been received thereby for a predetermined delay time.

14. The power-on reset circuit as claimed in claim 13, wherein the clamping signal generator includes:

a first flip-flop having a first input terminal coupled to the feedback unit for receiving the feedback signal therefrom, a first output terminal for outputting the feedback signal as a first output signal after the feedback signal has been received via the first input terminal for a predetermined unit time, and a first complement output terminal for outputting a complement of the feedback signal as a first complement output signal after the feedback signal has been received for the predetermined unit time;

a second flip-flop having a second input terminal coupled to the first complement output terminal of the first flip-flop for receiving the first complement output signal therefrom, and a second output terminal for outputting the first complement output signal as a second output signal after the first complement output signal has been received via the second input terminal for the predetermined unit time; and an output logic unit having a first input terminal coupled to the first complement output terminal for receiving the first complement output signal therefrom, and a second input terminal coupled to the second output terminal for receiving the second output signal therefrom, the output logic unit generating the clamping signal according to the first complement output signal and the second output signal.

15. The power-on reset circuit as claimed in claim 14, wherein the output logic unit is a logic NOR gate.

16. The power-on reset circuit as claimed in claim 13, wherein the clamping signal generator has a plurality of flip-flops connected to each other in series, each of the flip-flops having an input terminal, a first output terminal for outputting a first output signal, and a second output terminal for outputting a second output signal that is a complement of the first output signal, the input terminal of a first one of the flip-flops being coupled to the feedback unit for receiving the feedback signal therefrom, the first output terminal of the first one of the flip-flops outputting the feedback signal as a first output signal after the feedback signal has been received via the first input terminal for a predetermined unit time, the second output terminal of the first one of the flip-flops outputting a complement of the feedback signal as the first complement output signal after the feedback signal has been received for the predetermined unit time, one of the first and second output terminals of each of the first to the penultimate ones of the flip-flops being coupled to the input terminal of a corresponding next one of the flip-flops.

17. The power-on reset circuit as claimed in claim 16, wherein the clamping signal generator includes an output logic unit having a plurality of input terminals, one of the input terminals of the output logic unit being coupled to the first output terminal of one of the flip-flops for receiving the corresponding one of the first output signals therefrom, another one of the input terminals of the output logic unit being coupled to the second output terminal of another one of the flip-flops for receiving the corresponding one of the second output signals therefrom, the output logic unit generating the clamping signal according to the signals received via the input terminals thereof.

18. The power-on reset circuit as claimed in claim 13, wherein the trigger signal generator is an analog circuit, and the clamping signal generator is a digital circuit.

\* \* \* \* \*